(12) United States Patent
Karamoto

(10) Patent No.: US 12,464,792 B2
(45) Date of Patent: Nov. 4, 2025

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventor: Yuki Karamoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 584 days.

(21) Appl. No.: 17/865,400

(22) Filed: Jul. 15, 2022

(65) Prior Publication Data

US 2022/0352316 A1 Nov. 3, 2022

Related U.S. Application Data

(63) Continuation of application No. PCT/JP2021/025052, filed on Jul. 1, 2021.

(30) Foreign Application Priority Data

Aug. 24, 2020 (JP) ................................. 2020-140988

(51) Int. Cl.
*H10D 62/13* (2025.01)
*H01L 21/265* (2006.01)
(Continued)

(52) U.S. Cl.
CPC ..... *H10D 62/133* (2025.01); *H01L 21/26513* (2013.01); *H01L 21/266* (2013.01);
(Continued)

(58) Field of Classification Search
CPC ............ H01L 21/26513; H01L 21/266; H10D 12/038; H10D 62/127; H10D 62/133;
(Continued)

(56) References Cited

U.S. PATENT DOCUMENTS

2006/0180836 A1 8/2006 Ishida
2007/0252195 A1 11/2007 Yoshikawa
(Continued)

FOREIGN PATENT DOCUMENTS

JP 2006203131 A 8/2006
JP 2006228906 A 8/2006
(Continued)

OTHER PUBLICATIONS

International Search Report and (ISA/237) Written Opinion of the International Search Authority for International Patent Application No. PCT/JP2021/025052, issued/mailed by the Japan Patent Office on Sep. 28, 2021.

*Primary Examiner* — Fazli Erdem

(57) ABSTRACT

Provided is a semiconductor device including a drift region, a base region, two trench portions and a mesa portion, wherein at least one of the two trench portions is a gate trench portion, the mesa portion includes: a first conductivity type emitter region provided to be exposed on an upper surface of the mesa portion; a second conductivity type contact region provided to be exposed on the upper surface of the mesa portion alternately with the emitter region in an extending direction; and a second conductivity type connecting region with a higher doping concentration than the base region, wherein the connecting region is provided to overlap with the emitter region in a top view, is arranged apart from the gate trench portion, is arranged below the upper surface of the mesa portion, and connects two of the contact regions sandwiching the emitter region in the extending direction.

14 Claims, 18 Drawing Sheets

(51) Int. Cl.
*H01L 21/266* (2006.01)
*H10D 8/00* (2025.01)
*H10D 12/00* (2025.01)
*H10D 12/01* (2025.01)
*H10D 62/17* (2025.01)
*H10D 64/00* (2025.01)
*H10D 84/60* (2025.01)

(52) U.S. Cl.
CPC ........... *H10D 8/422* (2025.01); *H10D 12/038* (2025.01); *H10D 12/481* (2025.01); *H10D 62/393* (2025.01); *H10D 64/117* (2025.01); *H10D 84/617* (2025.01)

(58) Field of Classification Search
CPC .. H10D 62/142; H10D 64/519; H10D 84/617; H10D 84/811
USPC ......................................................... 257/140
See application file for complete search history.

(56) References Cited

U.S. PATENT DOCUMENTS

| | | |
|---|---|---|
| 2017/0141217 A1 | 5/2017 | Shirakawa |
| 2018/0182754 A1 | 6/2018 | Naito |
| 2018/0366578 A1* | 12/2018 | Naito ................... H10D 62/393 |
| 2018/0374948 A1 | 12/2018 | Naito |

FOREIGN PATENT DOCUMENTS

| | | |
|---|---|---|
| JP | 2007258617 A | 10/2007 |
| JP | 2008034794 A | 2/2008 |
| JP | 2018182279 A | 11/2018 |
| JP | 2019004060 A | 1/2019 |
| JP | 2019195093 A | 11/2019 |
| WO | 2016133027 A1 | 8/2016 |
| WO | 2018052098 A1 | 3/2018 |
| WO | 2018092787 A1 | 5/2018 |

* cited by examiner d-d

SEMICONDUCTOR DEVICE AND MANUFACTURING METHOD OF SEMICONDUCTOR DEVICE

The contents of the following Japanese and PCT patent applications are incorporated herein by reference:
2020-140988 filed in JP on Aug. 24, 2020 and
PCT/JP2021/025052 filed in WO on Jul. 1, 2021.

BACKGROUND

1. Technical Field

The present invention relates to a semiconductor device and a manufacturing method of the semiconductor device.

2. Related Art

Conventionally, a semiconductor device such as IGBT (insulated gate bipolar transistor) is known (see Patent Documents 1-4, for example).

Patent Document 1: Japanese Patent Application Publication No. 2019-195093
Patent Document 2: Japanese Patent Application Publication No. 2018-182279
Patent Document 3: Japanese Patent Application Publication No. 2008-34794
Patent Document 4: WO2018/52098

DESCRIPTION OF EXEMPLARY EMBODIMENTS

Figure 1:
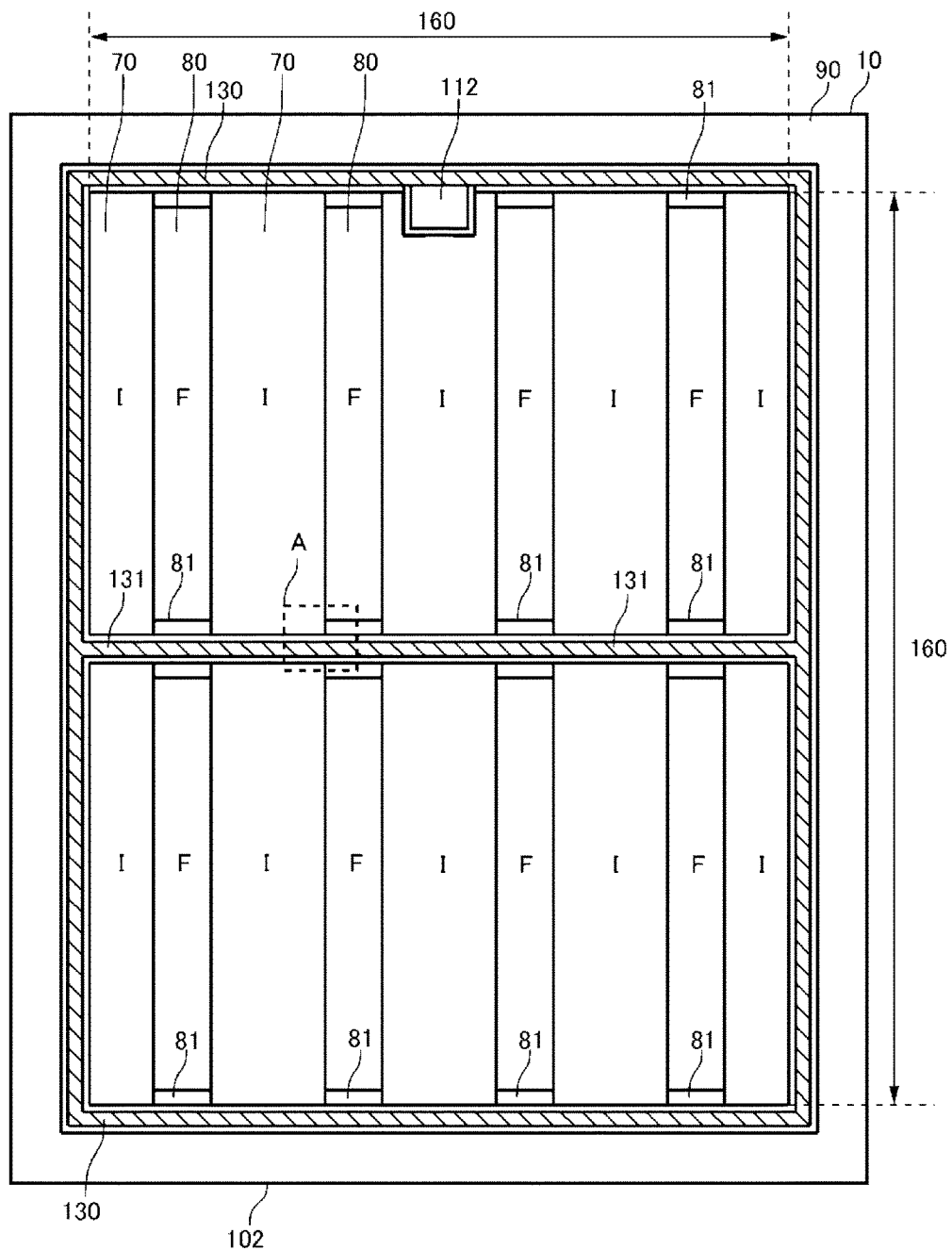
FIG. 1 is a top view showing an example of a semiconductor device 100 according to one embodiment of the present invention.

Hereinafter, the present invention will be described through embodiments of the invention, but the following embodiments do not limit the invention according to the claims. In addition, not all combinations of the features described in the embodiments necessarily have to be essential to solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely identify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing a donor or an acceptor into a semiconductor substrate to form a semiconductor exhibiting an N type conductivity type or a semiconductor exhibiting a P type conductivity type.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

In a region of N type, since a donor concentration is higher enough than an acceptor concentration, a carrier concentration in the region may be referred to as a donor concentration. Similarly, in a region of the P type, the carrier concentration of the region may be set as the acceptor concentration.

In addition, when a donor, an acceptor or a doping concentration distribution each has a peak, the peak value may be referred to as a concentration of the donor, the acceptor or the doping in the region. In a case in which the concentration of the donor, the acceptor or the doping is approximately uniform and the like, an average value of the concentration of the donor, the acceptor or the doping in the region may be referred to as the concentration of the donor, the acceptor or the doping.

FIG. 1 is a top view showing an example of a semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 has an end side 102 in a top view. When merely referred to as the top view in the present specification, it means that the semiconductor substrate 10 is viewed from an upper surface side. The semiconductor substrate 10 of the present example has two sets of end sides 102 opposite to each other in a top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor device such as an IGBT, or a diode portion 80 including a diode device such as a freewheeling diode (FWD). In the example in FIG. 1, the transistor portion 70 and the diode portion 80 are alternately arranged along a predefined array direction (the X axis direction in the present example) on the upper surface of the semiconductor substrate 10. In another example, in the active portion 160, the diode portion 80 is not provided but the transistor portion 70 may be provided.

In FIG. 1, a region in which the transistor portion 70 is arranged is marked with a symbol "I", and a region in which the diode portion 80 is arranged is marked with a symbol "F". In the present specification, a direction perpendicular to the array direction in a top view may be referred to as an extending direction (the Y axis direction in FIG. 1). Each of the transistor portion 70 and the diode portion 80 may have a longitudinal length in the extending direction. In other words, the length of the transistor portion 70 in the Y axis direction is greater than the width thereof in the X axis direction. Similarly, the length of the diode portion 80 in the Y axis direction is greater than the width thereof in the X axis direction. The extending direction of the transistor portion 70 and the diode portion 80, and the longitudinal direction of each trench portion described below may be the same.

The diode portion 80 has an N+ type cathode region in a region in contact with the lower surface of the semiconductor substrate 10. In the present specification, a region where the cathode region is provided is referred to as the diode portion 80. In other words, the diode portion 80 is a region that overlaps with the cathode region in a top view. In a region other than the cathode region on the lower surface of the semiconductor substrate 10, a P+ type collector region may be provided. In the present specification, the diode portion 80 may also include an extension region 81 where the diode portion 80 extends to a gate runner described below in the Y axis direction. On the lower surface of the extension region 81, a collector region is provided.

The transistor portion 70 has a P+ type collector region in a region in contact with the lower surface of the semiconductor substrate 10. In addition, in the transistor portion 70, a gate structure having an N type emitter region, a P type base region, a gate conductive portion and a gate dielectric film are periodically arranged on the upper surface side of the semiconductor substrate 10.

The semiconductor device 100 may have one or more pads above the semiconductor substrate 10. The semiconductor device 100 of the present example has a gate pad 112. The semiconductor device 100 may have a pad such as an anode pad, a cathode pad, and a current detection pad. Each pad is arranged in the vicinity of the end side 102. The region in the vicinity of the end side 102 refers to a region between the end side 102 and the emitter electrode in a top view. In the implementation of the semiconductor device 100, each pad may be connected to an external circuit via wiring such as a wire.

A gate potential is applied to the gate pad 112. The gate pad 112 is electrically connected to the conductive portion of the gate trench portion of the active portion 160. The semiconductor device 100 includes a gate runner to connect the gate pad 112 and the gate trench portion. In FIG. 1, the gate runner is hatched with diagonal lines.

The gate runner of the present example has an outer circumferential gate runner 130 and an active-side gate runner 131. The outer circumferential gate runner 130 is arranged between the active portion 160 and the end side 102 of the semiconductor substrate 10 in a top view. The outer circumferential gate runner 130 of the present example encloses the active portion 160 in a top view. A region enclosed by the outer circumferential gate runner 130 in a top view may be the active portion 160. In addition, the outer circumferential gate runner 130 is connected to the gate pad 112. The outer circumferential gate runner 130 is arranged above the semiconductor substrate 10. The outer circumferential gate runner 130 may be a metal wiring including aluminum and the like.

The active-side gate runner 131 is provided in the active portion 160. By providing the active-side gate runner 131 in the active portion 160, a variation in the wiring length from the gate pad 112 can be reduced for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 in the present example is provided extending in the X axis direction so as to cross the active portion 160 from one outer circumferential gate runner 130 to the other outer circumferential gate runner 130 substantially at a center of the Y axis direction. When the active portion 160 is divided by the active-side gate runner 131, the transistor portion 70 and the diode portion 80 may be alternately arranged in the X axis direction in each divided region.

The semiconductor device 100 of the present example includes an edge termination structure portion 90 between the active portion 160 and the end side 102. The edge termination structure portion 90 of the present example is arranged between the outer circumferential gate runner 130 and the end side 102. The edge termination structure portion 90 reduces electric field concentration on the upper surface side of the semiconductor substrate 10. The edge termination structure portion 90 may include at least one of a guard ring or a field plate provided in an annular shape to enclose the active portion 160.

Figure 2:
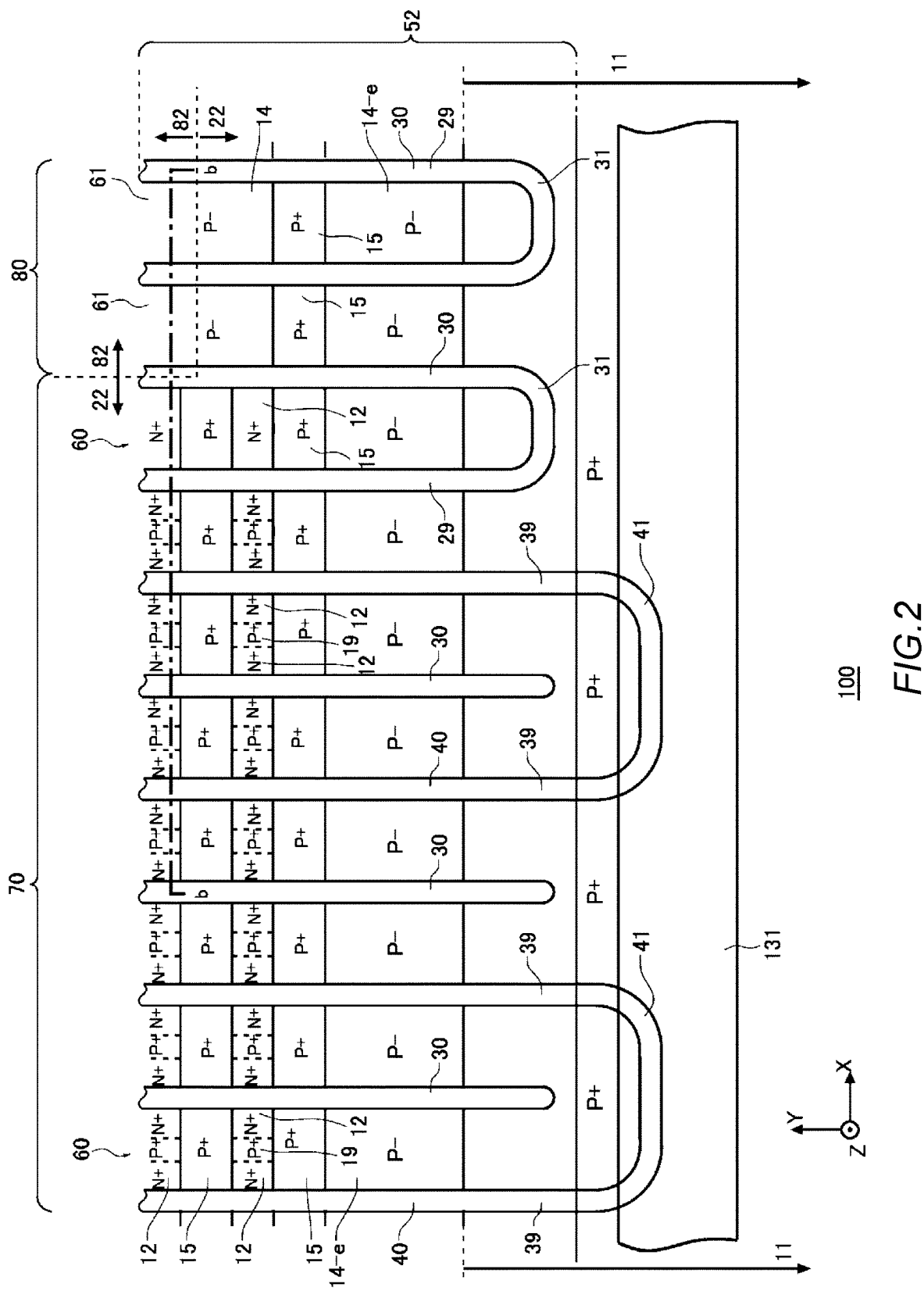
FIG. 2 is an enlarged view of the region A in FIG. 1.

FIG. 2 is an enlarged view of the region A in FIG. 1. The region A is a region including the transistor portion 70, the diode portion 80 and the active-side gate runner 131. The semiconductor device 100 of the present example includes a gate trench portion 40, a dummy trench portion 30, a well region 11, an emitter region 12, a base region 14, and a contact region 15 which are provided inside the upper surface side of the semiconductor substrate 10. Each of the gate trench portion 40 and the dummy trench portion 30 is an example of a trench portion. In addition, the semiconductor device 100 of the present example includes an emitter electrode 52 and the active-side gate runner 131 that are provided above the upper surface of the semiconductor substrate 10. The emitter electrode 52 and the active-side gate runner 131 are provided separately from each other.

An interlayer dielectric film is provided between the emitter electrode 52 and the active-side gate runner 131, and the upper surface of the semiconductor substrate 10, but is omitted in FIG. 1. On the interlayer dielectric film of the present example, a contact hole for connecting the emitter electrode 52 and the active-side gate runner 131 to the semiconductor substrate 10 is provided.

The emitter electrode 52 is provided above the gate trench portion 40, the dummy trench portion 30, the well region 11, the emitter region 12, the base region 14 and the contact region 15. The emitter electrode 52 is in contact with the emitter region 12, the contact region 15 and the base region 14 on the upper surface of the semiconductor substrate 10. In addition, the emitter electrode 52 is connected to a dummy conductive portion in the dummy trench portion 30.

The active-side gate runner 131 is connected to the gate trench portion 40. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The well region 11 is provided overlapping the active-side gate runner 131. The well region 11 is provided so as to extend with a predefined width even in a range not overlapping the active-side gate runner 131. The well region 11 of the present example is provided apart from an end of the contact hole 54 in the Y axis direction toward the active-side gate runner 131 side. The well region 11 is a second conductivity type region in which the doping concentration is higher than the base region 14. The base region 14 of the present example is a P− type, and the well region 11 is a P+ type.

Each of the transistor portion 70 and the diode portion 80 includes a plurality of trench portions arranged in the array direction. In the transistor portion 70 of the present example, one or more gate trench portions 40 and one or more dummy trench portions 30 are provided alternately along the array direction. In the diode portion 80 of the present example, the plurality of dummy trench portions 30 are provided along the array direction. In the diode portion 80 of the present example, the gate trench portion 40 is not provided.

The gate trench portion 40 of the present example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is preferably provided in a curved shape in a top view. By connecting between end portions of the two linear portions 39 in the Y axis direction by the edge portion 41, the electric field concentration at the end portions of the linear portions 39 can be reduced.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similar to the gate trench portion 40.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom portion in the depth direction of each trench portion is covered with the well region 11 at the end portion in the Y axis direction of each trench portion. Accordingly, the electric field concentration on the bottom portion of each trench portion can be reduced.

A mesa portion is provided between the trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of the present example is provided to extend in the extending direction (Y axis direction) along the trench on the upper surface of the semiconductor substrate 10. In the present example, a mesa portion 60 is provided in the transistor portion 70, and a mesa portion 61 is provided in the diode portion 80. In the case of simply mentioning "mesa portion" in the present specification, the mesa portion refers to each of the mesa portion 60 and the mesa portion 61.

Each mesa portion is provided with the base region 14. A region in the base region 14 exposed on the upper surface of the semiconductor substrate 10 in the mesa portion, which is arranged closest to the active-side gate runner 131 is referred to as a base region 14-e. While FIG. 2 shows the base region 14-e arranged at one end portion of each mesa portion in the extending direction, the base region 14-e is also arranged at the other end portion of each mesa portion. Each mesa portion may be provided with at least one of a first conductivity type emitter region 12 or a second conductivity type contact region 15 in a region sandwiched between the base regions 14-e in a top view. The emitter region 12 of the present example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 and the contact region 15 exposed on the upper surface of the semiconductor substrate 10. On the upper surface of the semiconductor substrate 10, each of the emitter region 12 and the contact region 15 is in contact with both of the two trench portions sandwiching the mesa portion 60. In other words, each of the emitter region 12 and the contact region 15 is provided across the entire width of the mesa portion 60 in the X axis direction (the array direction) on the upper surface of the semiconductor substrate 10. In addition, each of the emitter region 12 and the contact region 15 is arranged alternately along the extending direction (the Y axis direction).

At least one mesa portion 60 has at least one connecting region 19. The connecting region 19 is provided on the mesa portion 60 which has, from the two trench portion sandwiching the mesa portion 60, at least one trench portion which is the gate trench portion 40. The connecting region 19 is a P+ type region with a higher doping concentration than the base region 14. The connecting region 19 is provided to overlap with the emitter region 12 in a top view. Note that the connecting region 19 is arranged apart from the gate trench portion 40 in a top view.

In addition, the connecting region 19 is arranged below the upper surface of the semiconductor substrate 10 in the mesa portion 60. The emitter region 12 is provided between the connecting region 19 and the upper surface of the semiconductor substrate 10.

The connecting region 19 connects two contact regions 15 sandwiching the emitter region 12 in the Y axis direction. The connecting region 19 may be provided for each set of two contact regions 15. In other words, all the sets of two contact regions 15 adjacent to each other in the Y axis direction in the mesa portion 60 may be connected by the connecting region 19. In FIG. 2, a range in which the connecting region 19 is provided is shown with dashed lines. By providing the connecting region 19, as described below, a latch-up of the semiconductor device 100 when turning off can be suppressed.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15. In addition, in the mesa portion 61, the connecting region 19 is not provided.

A contact hole is provided on the interlayer dielectric film for covering each mesa portion, but is omitted in FIG. 2. The contact hole is arranged in the region sandwiched between the base regions 14-e. The contact hole of the present example is provided above each region of the contact region 15, the base region 14 and the emitter region 12. The contact hole may be arranged at a center in the array direction (the X axis direction) of the mesa portion.

In the diode portion 80, an N+ type cathode region 82 is provided in a region adjacent to the lower surface of the semiconductor substrate 10. On the lower surface of the semiconductor substrate 10, a P+ type collector region 22 may be provided in a region in which the cathode region 82 is not provided. In FIG. 2, a boundary between the cathode region 82 and the collector region 22 is shown by a dotted line.

Figure 3:
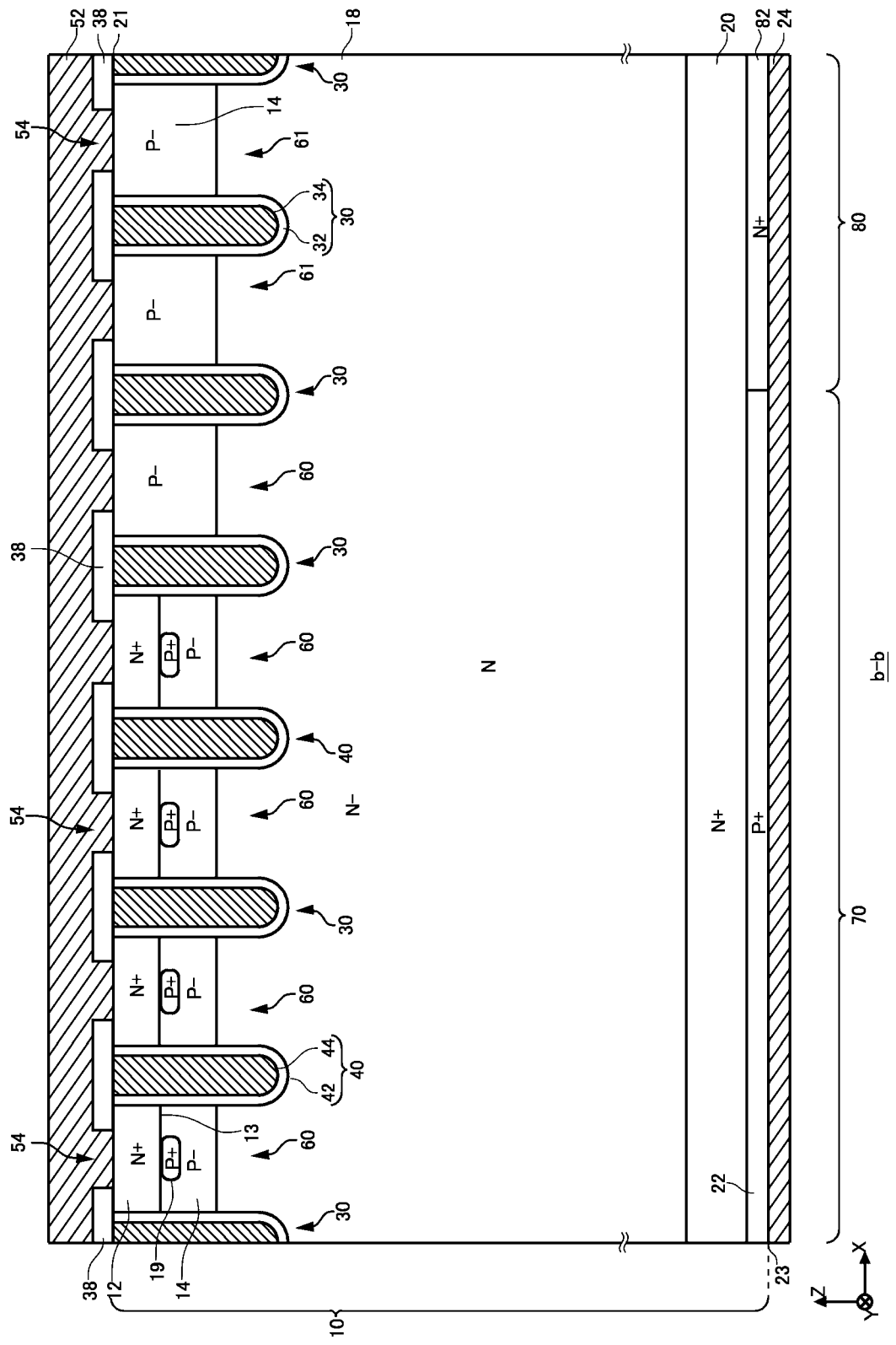
FIG. 3 shows an example of a cross section b-b of FIG. 2.

FIG. 3 shows an example of a cross section b-b of FIG. 2. The cross section b-b is an XZ plane passing through the emitter region 12 and the cathode region 82. The semiconductor device 100 of the present example has the semiconductor substrate 10, the interlayer dielectric film 38, the emitter electrode 52 and the collector electrode 24 in the cross section. The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the present specification, the direction in which the emitter electrode 52 is connected with the collector electrode 24 (the Z axis direction) is referred to as a depth direction.

The semiconductor substrate 10 has an N− type drift region 18. The drift region 18 is provided in each of the transistor portion 70 and the diode portion 80.

In the mesa portion 60 of the transistor portion 70, an N+ type emitter region 12 and a P− type base region 14 are provided sequentially from the upper surface 21 side of the semiconductor substrate 10. The drift region 18 is provided below the base region 14. The mesa portion 60 may be provided with an N+ type accumulation region. The accumulation region is arranged between the base region 14 and the drift region 18. By providing the high concentration accumulation region between the drift region 18 and the base region 14, the carrier injection enhancement effect (IE effect) can be enhanced, and an ON voltage can be reduced.

The emitter region 12 is exposed on the upper surface 21 of the semiconductor substrate 10 and is provided in contact with the gate trench portion 40. The emitter region 12 is in contact with the trench portions on both sides of the mesa portion 60. The emitter region 12 has a higher doping concentration than the drift region 18.

The base region 14 is provided below the emitter region 12. The base region 14 of the present example is provided in contact with the emitter region 12. The base region 14 is in contact with the trench portions on the both sides of the mesa portion 60.

The connecting region 19 is provided in the mesa portion 60. As described above, the connecting region 19 is overlapping with the emitter region 12 in a top view. In other words, the connecting region 19 is overlapping with the emitter region 12 in the Z axis direction. The connecting region 19 of the present example is in contact with the lower end 13 of the emitter region 12. The lower end 13 of the emitter region 12 is a region provided in the lowest position in the emitter region 12.

The mesa portion 61 of the diode portion 80 is provided with a P− type base region 14 in contact with the upper surface 21 of the semiconductor substrate 10. The drift region 18 is provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 may have a plurality of donor concentration peaks with donor concentrations higher than the drift region 18. The buffer region 20 may function as a field stop layer which prevents a depletion layer which is expanding from the lower end of the base region 14 from reaching the P+ type collector region 22 and the N+ type cathode region 82.

In the transistor portion 70, the P+ type collector region 22 is provided below the buffer region 20. An acceptor concentration of the collector region 22 is higher than an acceptor concentration of the base region 14. The collector region 22 may include the same acceptor as the base region 14, or may include a different acceptor. The acceptor of the collector region 22 is, for example, boron.

Below the buffer region 20 in the diode portion 80, the N+ type cathode region 82 is provided. The donor concentration of the cathode region 82 is higher than the donor concentration of the drift region 18. A donor of the cathode region 82 is, for example, hydrogen or phosphorous. Note that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The collector electrode 24 is formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. In a region provided at least one of the emitter region 12 or the contact region 15, each trench portion penetrates these doping regions to reach the drift region 18. The configuration in which the trench portion penetrates the region is not limited to the one manufactured in an order of forming the trench portion after forming the region. The configuration in which a doping region is formed between the trench portions after the trench portions are formed is also included in the configuration in which the trench portion penetrates the doping region.

As described above, the transistor portion 70 is provided with the gate trench portion 40 and the dummy trench portion 30. In the diode portion 80, the dummy trench portion 30 is provided, and the gate trench portion 40 is not provided. In the present example, a boundary between the diode portion 80 and the transistor portion 70 in the X axis direction is the boundary between the cathode region 82 and the collector region 22.

The gate trench portion 40 includes a gate trench, a gate dielectric film 42, and a gate conductive portion 44 provided on the upper surface 21 of the semiconductor substrate 10. The gate dielectric film 42 is provided to cover the inner wall of the gate trench. The gate dielectric film 42 may be formed by oxidizing or nitriding a semiconductor on the inner wall of the gate trench. The gate conductive portion 44 is provided closer to the inner side than the gate dielectric film 42 inside the gate trench. In other words, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 on the upper surface 21 of the semiconductor substrate 10. The gate conductive portion 44 is electrically connected to the gate runner. When a predefined gate voltage is applied to the gate conductive portion 44, a channel is formed by an electron inversion layer in a surface layer of the base region 14 at a boundary in contact with the gate trench portion 40.

The connecting region 19 is arranged apart from the gate trench portion 40. Accordingly, by providing the connecting region 19, a variation in a threshold voltage of the transistor portion 70 can be suppressed. A boundary between the connecting region 19 and the base region 14 in the X axis direction may be a position in which the doping concentration starts to increase in a direction from the trench portion toward the connecting region 19.

A P type dopant in the connecting region 19 and a P type dopant in the base region 14 may be dopants of the same element. In other words, the connecting region 19 and the base region 14 may be formed by implanting the dopants of the same element. Note that when a plurality of types of P type dopants are included in each region, a P type dopant with the highest concentration in each region is referred to as a P type dopant in the region.

In another example, the P type dopant of the connecting region 19 and the P type dopant of the base region 14 may be different. Accordingly, the shape of the connecting region 19 can be easily controlled.

The P type dopant in the connecting region 19 may be a dopant having a less diffusion coefficient in the semiconductor substrate 10 than the P type dopant in the base region 14. In other words, the P type dopant in the connecting region 19 may be a dopant which is more difficult to diffuse in the semiconductor substrate 10 than the P type dopant in the base region 14. Accordingly, the P type dopant implanted into the connecting region 19 can be suppressed from diffusing to the gate trench portion 40, and the variation in the threshold voltage can be suppressed.

The dummy trench portions 30 may have the same structure as the gate trench portions 40 in the cross section. The dummy trench portion 30 includes a dummy trench, dummy dielectric film 32 and a dummy conductive portion 34 provided on the upper surface 21 of the semiconductor substrate 10. The dummy conductive portion 34 may be electrically connected to the emitter electrode 52. The dummy dielectric film 32 is provided to cover an inner wall of the dummy trench. The dummy conductive portion 34 is provided inside the dummy trench and is provided closer to the inner side than the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

Figure 4:
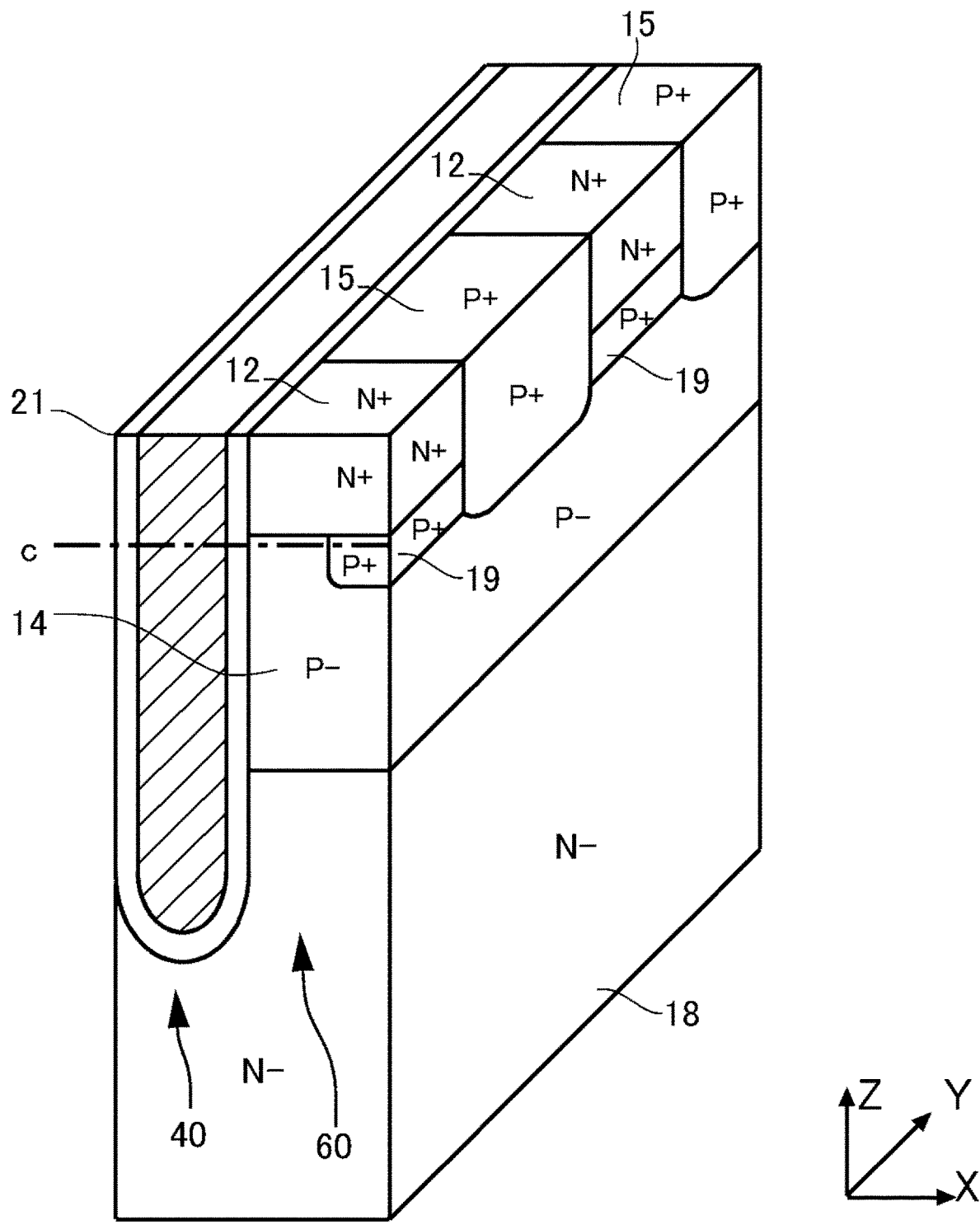
FIG. 4 is a perspective cross-sectional view showing an example of a mesa portion 60.

FIG. 4 is a perspective cross-sectional view showing an example of a mesa portion 60. In FIG. 4, a YZ cross section and an XZ cross section passing the connecting region 19 in the mesa portion 60 are shown. As described above, the connecting region 19 connects two contact regions 15 sandwiching the emitter region 12 in the extending direction (the Y axis direction). In addition, the connecting region 19 is arranged apart from the gate trench portion 40.

Figure 5:
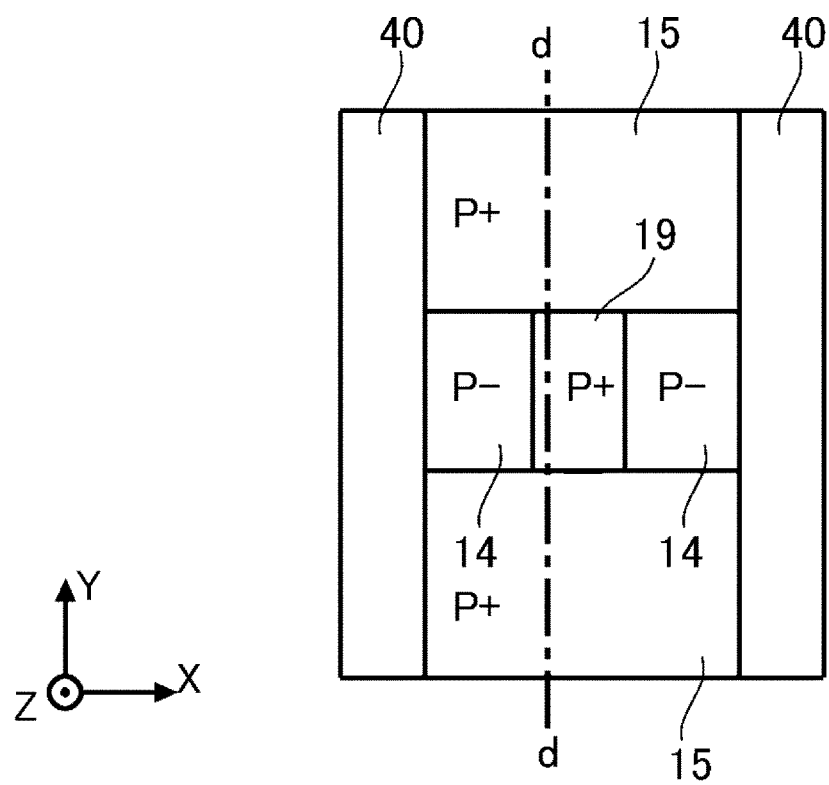
FIG. 5 shows an example of an XY cross section of the mesa portion 60 in a height position C shown in FIG. 4.

FIG. 5 shows an example of an XY cross section of the mesa portion 60 in a height position C shown in FIG. 4. The cross section is passing the connecting region 19. The connecting region 19 is sandwiched between the contact regions 15 in the Y axis direction. In addition, the connecting region 19 of the present example is sandwiched between the base regions 14 in the X axis direction.

The mesa portion 60 shown in FIG. 5 is sandwiched between two gate trench portions 40. In this case, the connecting region 19 is preferred to be arranged at a center between the two gate trench portions 40 in the X axis direction. In other words, a distance between the connecting region 19 and one of the gate trench portions 40 is preferred to be the same as a distance between the connecting region 19 and the other gate trench portions 40. Accordingly, the connecting region 19 can be easily spaced apart in relation to each of the two gate trench portions 40. In another example, one of the trench portions may be a dummy trench portion 30. A distance between the gate trench portion 40 and the connecting region 19 in the X axis direction may be equal to or greater than 1 µm, may be equal to or greater than 2 µm, or may be equal to or greater than 3 µm.

Figure 6:
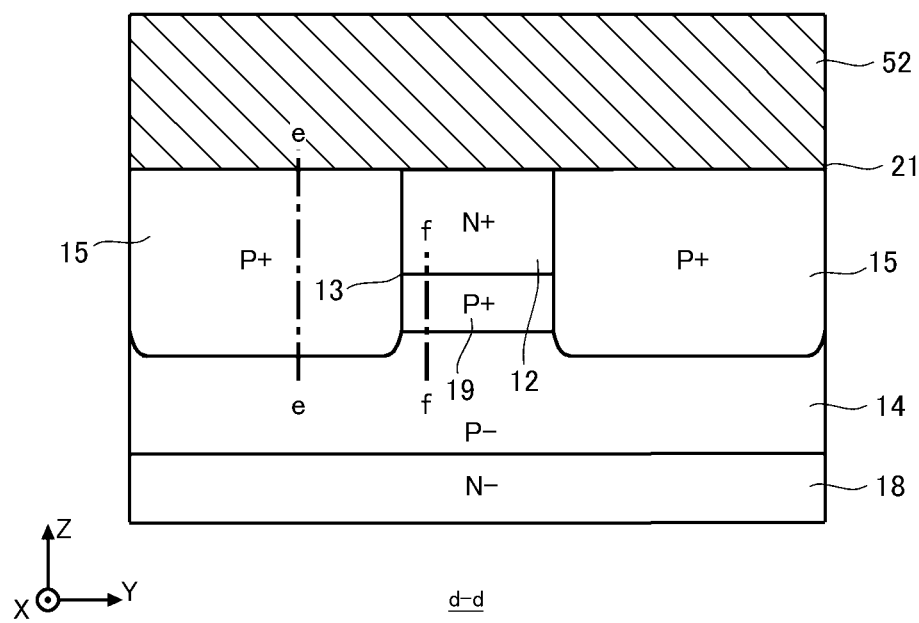
FIG. 6 shows an example of a cross section in a line d-d of FIG. 5.

FIG. 6 shows an example of a cross section in a line d-d of FIG. 5. The cross section is a YZ plane passing the connecting region 19 in the mesa portion 60. The connecting region 19 of the present example is in contact with the lower end 13 of the emitter region 12.

If the transistor portion 70 of the semiconductor device 100 is turned off, electron holes which are existing on the drift region 18 and the like are extracted to the emitter electrode 52. By providing a P type contact region 15 of high concentration, resistance in a movement path of the electron holes can be reduced and a latch-up can be suppressed.

Furthermore, by providing the connecting region 19, the two contact regions 15 sandwiching the emitter region 12 can be connected to the P type region of high concentration. Thus, even when the electron holes are moved for some reason between the two contact regions 15 when turning off, the resistance in the movement path of the electron holes can be reduced and the latch-up can be suppressed.

Figure 7:
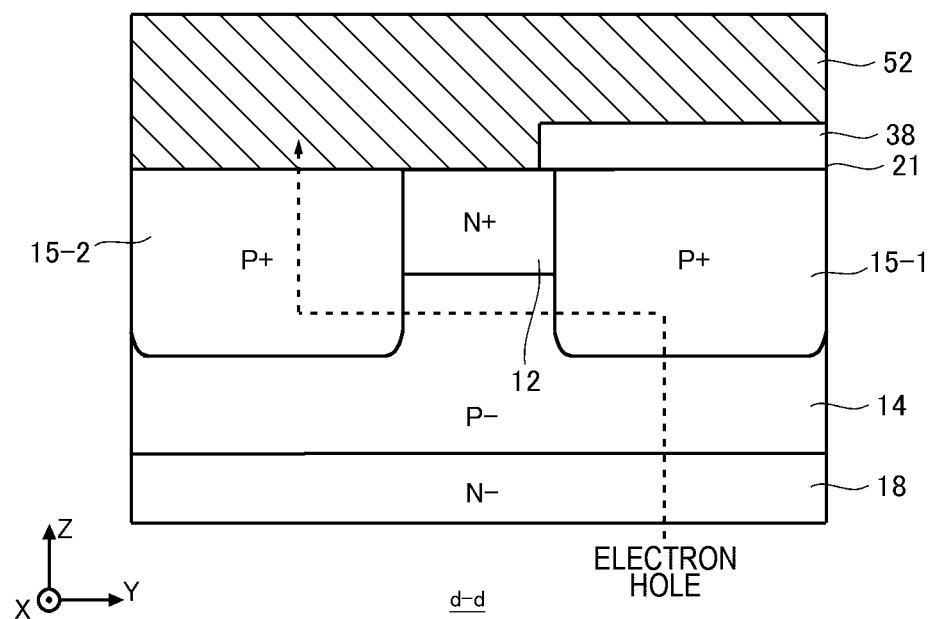
FIG. 7 shows a cross-section d-d in a comparative example.

FIG. 7 shows a cross-section d-d in a comparative example. In the present example, an interlayer dielectric film 38 remains at the patterning of the interlayer dielectric film 38, and one contact region 15-1 is covered with the interlayer dielectric film 38. In this case, at least a part of the electron holes existing in the region below the contact region 15-1 is moved to the contact region 15-1 when turning off. However, since the contact region 15-1 is covered with the interlayer dielectric film 38, the electron holes of the contact region 15-1 cannot be moved to the emitter electrode 52 but are moved to an adjacent contact region 15-2.

In the comparative example, the connecting region 19 is not provided. Thus, the electron holes moved from the contact region 15-1 to the contact region 15-2 pass the base region 14 of low concentration. In FIG. 7, the movement path of the electron holes is schematically shown by a dashed arrow. In this case, the resistance in the movement path of the electron hole increases, thereby increasing a voltage of the path. Accordingly, a parasitic npn transistor may be turned on to cause a latch-up breakdown.

Meanwhile, in the examples described in FIG. 1 to FIG. 6, the adjacent two contact regions 15 are connected by the connecting region 19 of high concentration. Thus, the electron hole can move between the adjacent two contact regions 15 via the connecting region 19 and can reduce the resistance of the movement path of the electron holes. Accordingly, the latch-up can be suppressed.

Figure 8A:
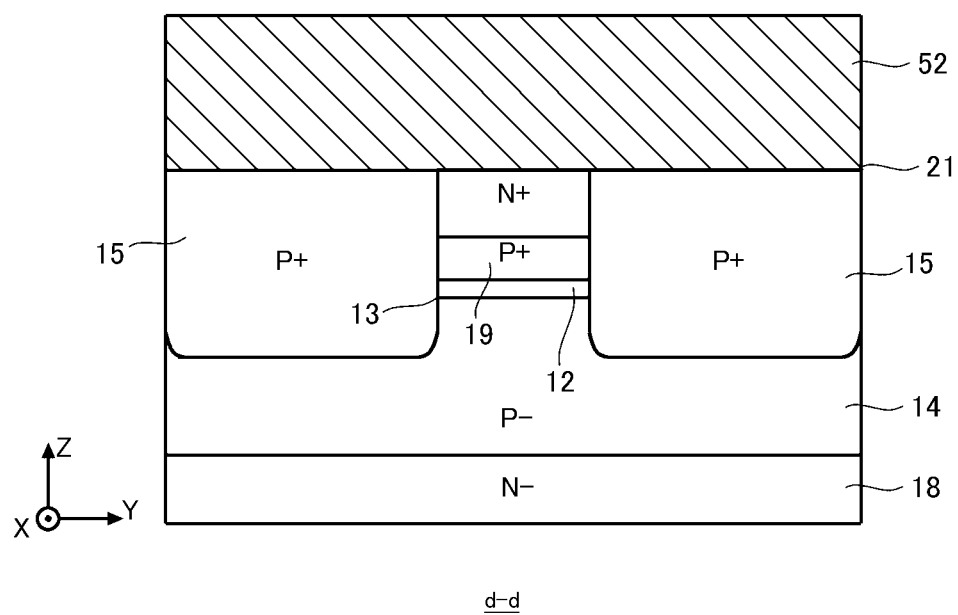
FIG. 8A shows another example of the cross-section d-d.
Figure 8B:
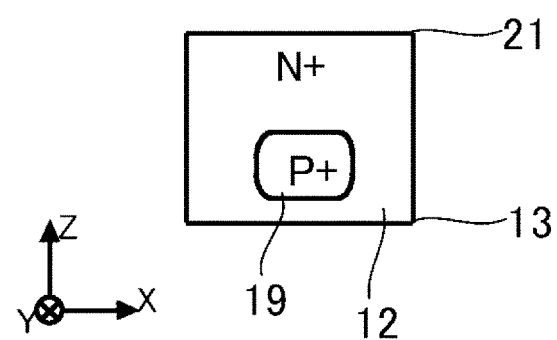
FIG. 8B shows an exemplary arrangement of an emitter region 12 and a connecting region 19 in an XZ plane.

FIG. 8A and FIG. 8B show other exemplary arrangements of the connecting region 19. FIG. 8A shows another example of the cross-section d-d. FIG. 8B shows an exemplary arrangement of an emitter region 12 and a connecting region 19 in an XZ plane. In the present example, a depth position in which the connecting region 19 is arranged is different from the example in FIG. 1 to FIG. 6. The other structures are the same as any of the examples described in FIG. 1 to FIG. 6.

At least a part of the connecting region 19 may be arranged inside the emitter region 12. In other words, at least a partial region of the connecting region 19 is sandwiched by the emitter region 12 in the X axis direction. The entire connecting region 19 of the present example is arranged inside the emitter region 12. For example, the entire connecting region 19 is arranged above the lower end 13 of the emitter region 12. Note that the connecting region 19 is not contacting the upper surface 21 of the semiconductor substrate 10.

Figure 9A:
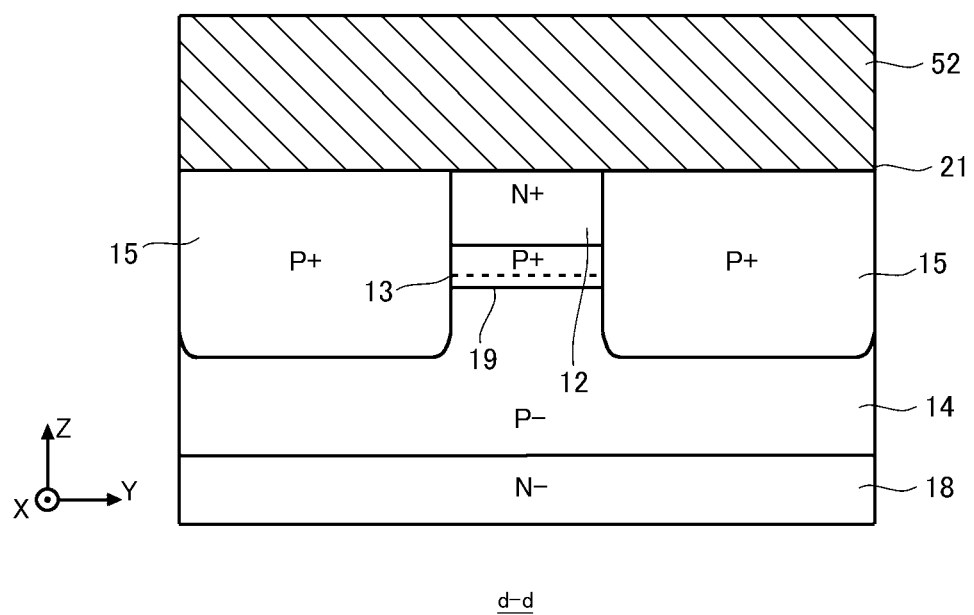
FIG. 9A shows another example of the cross-section d-d.
Figure 9B:
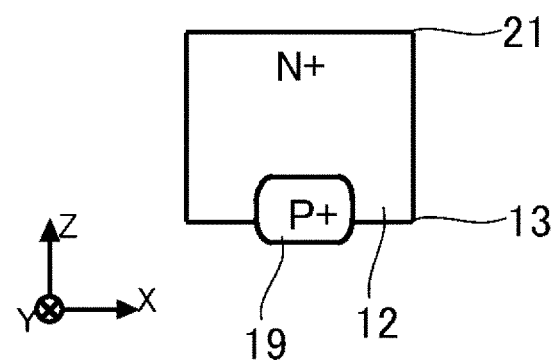
FIG. 9B shows an exemplary arrangement of an emitter region 12 and a connecting region 19 in an XZ plane.

FIG. 9A and FIG. 9B show other exemplary arrangements of the connecting region 19. FIG. 9A shows another example of the cross-section d-d. FIG. 9B shows an exemplary arrangement of an emitter region 12 and a connecting region 19 in an XZ plane. In the present example, a depth position in which the connecting region 19 is arranged is different from the example in FIG. 1 to FIG. 6. The other structures are the same as any of the examples described in FIG. 1 to FIG. 6. A partial region of the connecting region 19 of the present example is arranged inside the emitter region 12, and the other partial region of the connecting region 19 is arranged below the lower end 13 of the emitter region 12.

Figure 10A:
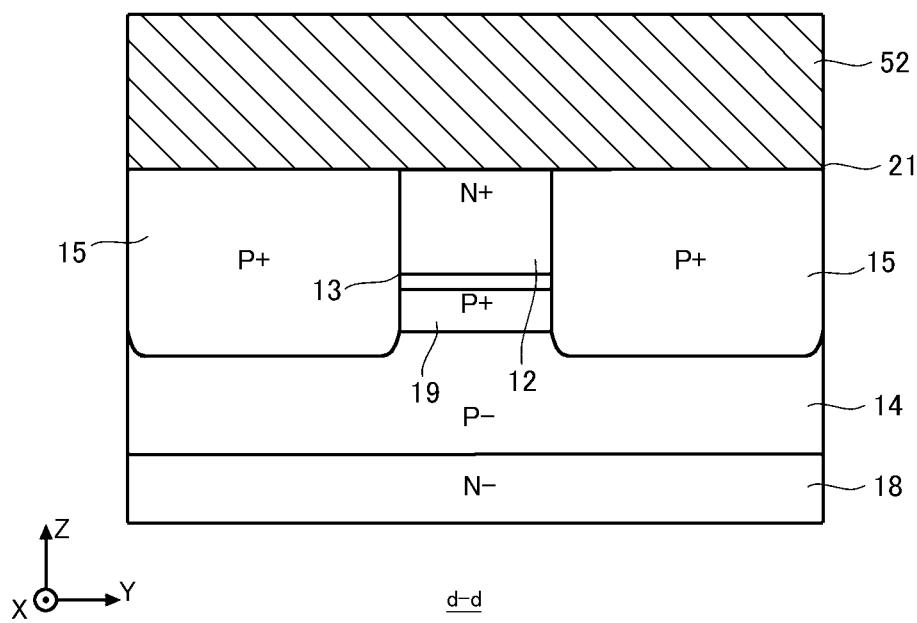
FIG. 10A shows another example of the cross-section d-d.
Figure 10B:
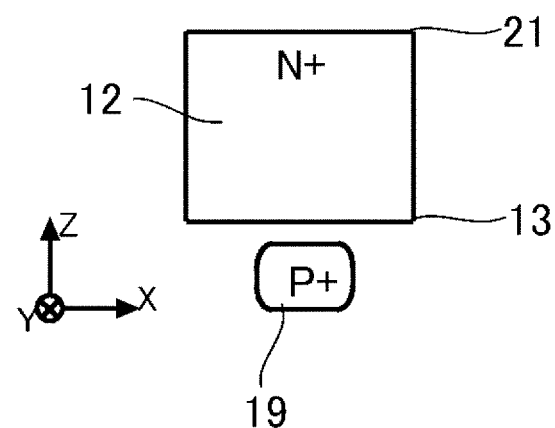
FIG. 10B shows an exemplary arrangement of an emitter region 12 and a connecting region 19 in an XZ plane.

FIG. 10A and FIG. 10B show other exemplary arrangements of the connecting region 19. FIG. 10A shows another example of the cross-section d-d. FIG. 10B shows an exemplary arrangement of an emitter region 12 and a connecting region 19 in an XZ plane. In the present example, a depth position in which the connecting region 19 is arranged is different from the example in FIG. 1 to FIG. 6. The other structures are the same as any of the examples described in FIG. 1 to FIG. 6. The connecting region 19 of the present example is arranged below the lower end 13 of the emitter region 12. In other words, the connecting region 19 is arranged apart from the emitter region 12. The base region 14 may be provided between the connecting region 19 and the emitter region 12.

Figure 11:
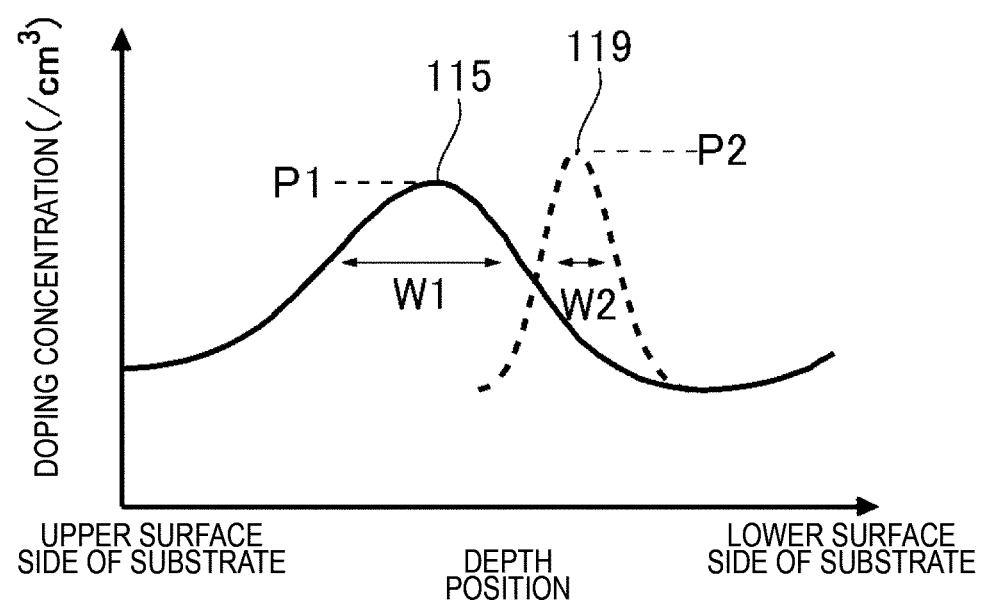
FIG. 11 shows an example of a doping concentration distribution in a depth direction of a contact region 15 and the connecting region 19.

FIG. 11 shows an example of a doping concentration distribution in a depth direction of a contact region 15 and the connecting region 19. A doping concentration distribution of the present example corresponds to the doping concentration distribution in the line e-e and the line f-f shown in FIG. 6. In FIG. 11, a doping concentration distribution of the contact region 15 is shown with a solid line, and a doping concentration distribution of the connecting region 19 is shown with a dashed line. The doping concentration distribution of the contact region 15 has a concentration peak 115, and the doping concentration distribution of the connecting region 19 has a concentration peak 119.

The doping concentration of the contact region 15 is referred to as P1 and the doping concentration of the connecting region 19 is referred to as P2. The maximum doping concentration of each region may be referred to as a doping concentration of each region. The doping concentration P2 of connecting region 19 may be higher than the doping concentration P1 of the contact region 15. In this case, the resistance of the movement path of the electron holes between the contact regions 15 can be further reduced to suppress the latch-up.

In addition, if the doping concentration P1 of the contact region 15 is too high, the dopant in the contact region 15 may diffuse in the Y axis direction, to reduce the emitter region 12. According to the present example, the latch-up is easily suppressed while securing the length of the emitter region 12.

The doping concentration P2 of the connecting region 19 may be equal to or greater than $1 \times 10^{18}/cm^3$ and equal to or less than $1 \times 10^{21}/cm^3$. The doping concentration P1 of the contact region 15 may be equal to or less than 10% of the doping concentration P2. In another example, the doping concentration P1 may be the same as the doping concentration P2, or may be greater than the doping concentration P2.

In addition, a full width at half maximum of the concentration peak 115 of the contact region 15 is referred to as W1, and a full width at half maximum of the concentration peak 119 of the connecting region 19 is referred to as W2. The full width at half maximum W2 may be less than the full width at half maximum W1. The full width at half maximum of the concentration peak can be adjusted by heat treatment temperature, heat treatment time, the dopant type or the like after implanting the dopant. The full width at half maximum W2 may be equal to or less than 50% of the full width at half maximum W1. According to the present example, due to a short diffusing distance of the P type dopant which is implanted into the connecting region 19, a distance between the connecting region 19 and the gate trench portion 40 can be easily secured.

In addition, a position of a vertex of each concentration peak is referred to as a position of the concentration peak. The concentration peak 115 may be arranged closer to the upper surface 21 side of the semiconductor substrate 10 than the concentration peak 119. The concentration peak 115 and the concentration peak 119 may be arranged on the same depth position, or the concentration peak 119 may be arranged closer to the upper surface 21 side than the concentration peak 115.

Figure 12:
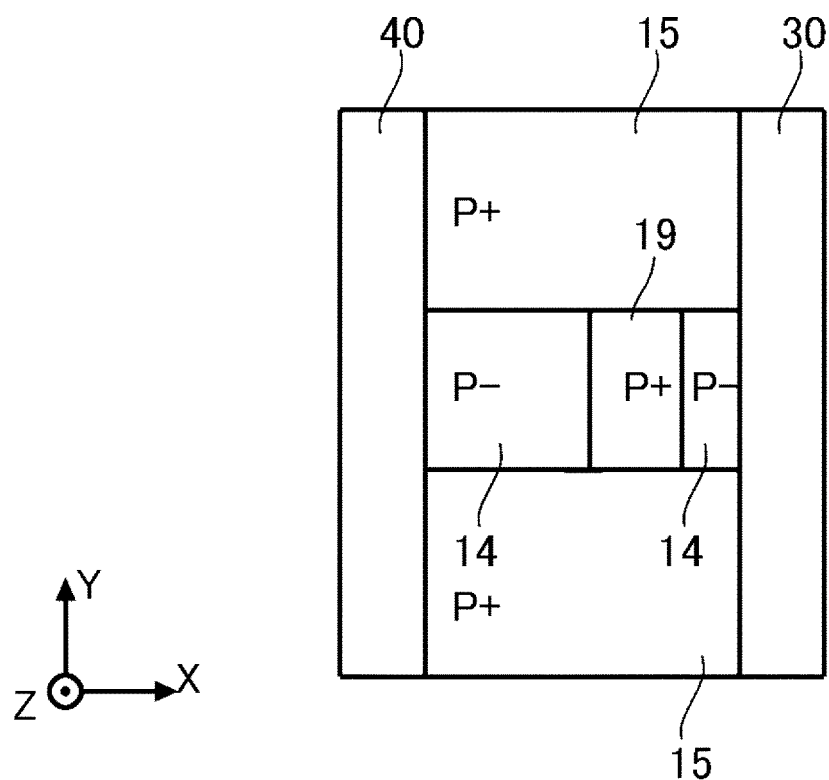
FIG. 12 shows another example of an XY cross section of the mesa portion 60 in a height position C shown in FIG. 4.

FIG. 12 shows another example of an XY cross section of the mesa portion 60 in a height position C shown in FIG. 4. A position in the X axis direction of the connecting region 19 of a mesa portion 60 of the present example is different from the example in FIG. 4. In addition, the mesa portion 60 of the present example is also sandwiched between the gate trench portion 40 and the dummy trench portion 30. The other structures are the same as the example in FIG. 4.

Between the two trench portions, the connecting region 19 of the present example is arranged closer to the dummy trench portion 30. In other words, a distance in the X axis direction between the connecting region 19 and the gate trench portion 40 is greater than a distance in the X axis direction between the connecting region 19 and the dummy trench portion 30. The connecting region 19 may contact the dummy trench portion 30. Accordingly, the distance between the connecting region 19 and the gate trench portion 40 can be increased. Thus, the effect on the threshold voltage of the transistor portion 70 caused by providing the connecting region 19 can be reduced.

Figure 13:
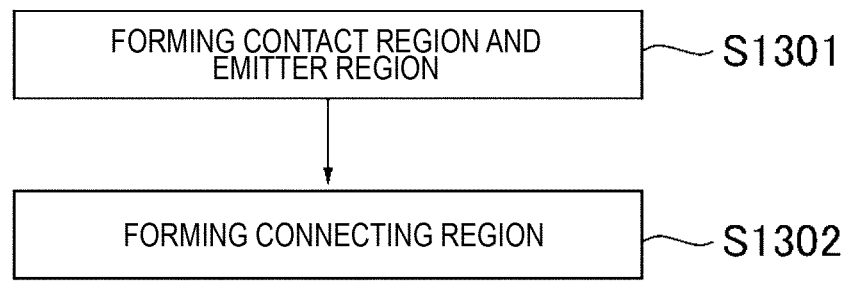
FIG. 13 shows a partial process of a manufacturing method of the semiconductor device 100.

FIG. 13 shows a partial process of a manufacturing method of the semiconductor device 100. First, in a first step S1301, a base region 14, each trench portion, each mesa portion, emitter region 12 and contact region 15 are formed on a semiconductor substrate 10 having a drift region 18. Each region can be formed by implanting a dopant into the semiconductor substrate 10 and applying a heat treatment. Each trench portion can be formed by forming a trench with selectively etching the upper surface 21 of the semiconductor substrate 10 and providing a dielectric film and a conductive portion inside the trench. In the first step S1301, an interlayer dielectric film 38 and a contact hole 54 may be formed.

Then, in a second step S1302, a connecting region 19 is formed. The connecting region 19 can be formed, from the upper surface 21 of the mesa portion 60, by selectively implanting a P type dopant and applying a heat treatment.

Figure 14:
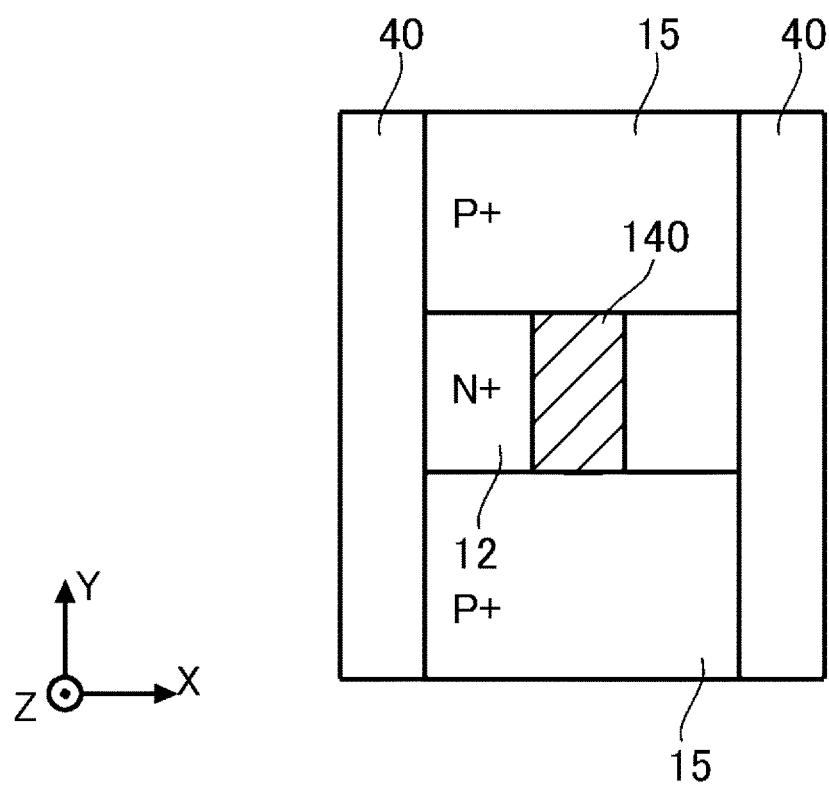
FIG. 14 shows an example of an implantation region 140 into which a P type dopant is implanted in a second step S1302.

FIG. 14 shows an example of an implantation region 140 into which a P type dopant is implanted in a second step S1302. The implantation region 140 is shown by the hatching of diagonal lines in FIG. 14. Regions other than the implantation region 140 are masked by a resist and the like. in the present example, the entire contact region 15 is masked and a part of the emitter region 12 is also masked. In addition, each trench portion is masked. In other words, the implantation region 140 is a region with the same range as the connecting region 19 described in FIG. 1 to FIG. 13 in a top view.

According to the present example, the contact region 15 is masked and a P type dopant of high concentration is implanted into the implantation region 140. Thus, by forming the connecting region 19, a variation in the doping concentration distribution of the contact region 15 can be suppressed. Accordingly, characteristic variations of semiconductor device 100 can be suppressed.

Figure 15:
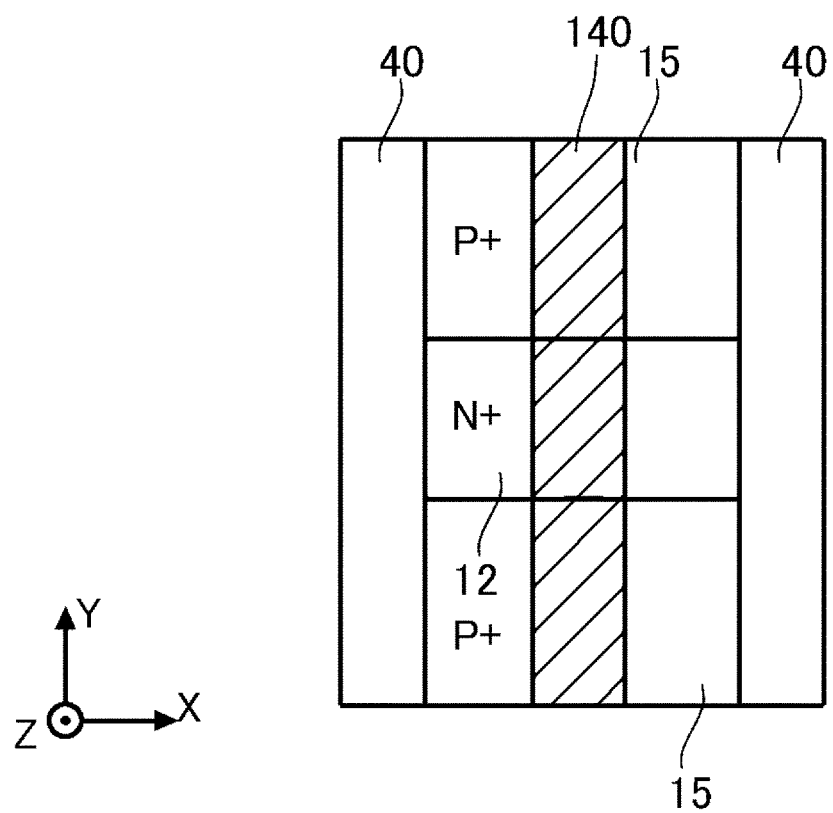
FIG. 15 shows another example of the implantation region 140.

FIG. 15 shows another example of the implantation region 140. In the present example, a P type dopant is implanted into a region in which connecting region 19 is to be formed and at least a partial region of a region in which the contact region 15 is formed. More specifically, the P type dopant is implanted into a region of the contact region 15, which is overlapped when the connecting region 19 is extending in the Y axis direction. The implantation region 140 may traverse the contact region 15 in the Y axis direction, or may be terminated in the Y axis direction inside the contact region 15. According to the present example, the connecting region 19 and the contact region 15 can be certainly connected. In addition, when the implantation region 140 traverses the contact region 15, since the mask may not be arranged discretely in the Y axis direction, the manufacturing is facilitated.

While the embodiments of the present invention have been described, the technical scope of the invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 semiconductor substrate
11 well region
12 emitter region
13 lower end
14 base region
15 contact region
18 drift region
19 connecting region
20 buffer region
21 upper surface
22 collector region
23 lower surface
24 collector electrode
29 linear portion
30 dummy trench portion 31 edge portion
32 dummy dielectric film
34 dummy conductive portion
38 interlayer dielectric film
39 linear portion
40 gate trench portion
41 edge portion
42 gate dielectric film
44 gate conductive portion
52 emitter electrode
54 contact hole
60, 61 mesa portion
70 transistor portion
80 diode portion
81 extension region
82 cathode region
90 edge termination structure portion
100 semiconductor device
102 end side
112 gate pad
115 concentration peak
119 concentration peak
130 outer circumferential gate runner
131 active-side gate runner
140 implantation region
160 active portion

What is claimed is:

1. A semiconductor device comprising a semiconductor substrate, wherein
the semiconductor substrate includes:
a first conductivity type drift region;
a second conductivity type base region provided between the drift region and an upper surface of the semiconductor substrate;
two trench portions which are provided to extend in a predetermined extending direction on the upper surface of the semiconductor substrate, and provided from the upper surface of the semiconductor substrate to the drift region; and
a mesa portion provided between the two trench portions, wherein at least one of the two trench portions is a gate trench portion, and
the mesa portion includes:
a first conductivity type emitter region having a higher doping concentration than the drift region, which is provided to be exposed on the upper surface of the mesa portion and provided to contact both of the two trench portions;
a second conductivity type contact region provided to be exposed on the upper surface of the mesa portion alternately with the emitter region in the extending direction, and provided to contact both of the two trench portions; and
a second conductivity type connecting region with a higher doping concentration than the base region, wherein the connecting region is provided to overlap with the emitter region in a top view, arranged apart from the gate trench portion, arranged below the upper surface of the mesa portion, and connects two of the contact regions sandwiching the emitter region in the extending direction, wherein a lower end of the connecting region is provided above a lower end of the contact region, wherein
one of the two trench portions is the gate trench portion and the other is a dummy trench portion, and
the connecting region is arranged, between the two trench portions, closer to the dummy trench portion.

2. The semiconductor device according to claim 1, wherein the connecting region is arranged below a lower end of the emitter region.

3. A semiconductor device comprising a semiconductor substrate, wherein
the semiconductor substrate includes:
a first conductivity type drift region;
a second conductivity type base region provided between the drift region and an upper surface of the semiconductor substrate;
two trench portions which are provided to extend in a predetermined extending direction on the upper surface of the semiconductor substrate, and provided from the upper surface of the semiconductor substrate to the drift region; and
a mesa portion provided between the two trench portions, wherein at least one of the two trench portions is a gate trench portion, and
the mesa portion includes:
a first conductivity type emitter region having a higher doping concentration than the drift region, which is provided to be exposed on the upper surface of the mesa portion and provided to contact both of the two trench portions;
a second conductivity type contact region provided to be exposed on the upper surface of the mesa portion alternately with the emitter region in the extending direction, and provided to contact both of the two trench portions; and
a second conductivity type connecting region with a higher doping concentration than the base region, wherein the connecting region is provided to overlap with the emitter region in a top view, arranged apart from the gate trench portion, arranged below the upper surface of the mesa portion, and connects two of the contact regions sandwiching the emitter region in the extending direction, wherein a doping concentration of the connecting region is higher than a doping concentration of the contact region.

4. A semiconductor device comprising a semiconductor substrate, wherein
the semiconductor substrate includes:
a first conductivity type drift region;
a second conductivity type base region provided between the drift region and an upper surface of the semiconductor substrate;
two trench portions which are provided to extend in a predetermined extending direction on the upper surface of the semiconductor substrate, and provided from the upper surface of the semiconductor substrate to the drift region; and
a mesa portion provided between the two trench portions, wherein at least one of the two trench portions is a gate trench portion, and
the mesa portion includes:
a first conductivity type emitter region having a higher doping concentration than the drift region, which is provided to be exposed on the upper surface of the mesa portion and provided to contact both of the two trench portions;
a second conductivity type contact region provided to be exposed on the upper surface of the mesa portion alternately with the emitter region in the extending direction, and provided to contact both of the two trench portions; and
a second conductivity type connecting region with a higher doping concentration than the base region, wherein the connecting region is provided to overlap with the emitter region in a top view, arranged apart from the gate trench portion, arranged below the upper surface of the mesa portion, and connects two of the contact regions sandwiching the emitter region in the extending direction, wherein the connecting region includes a second conductivity type dopant which is different from a second conductivity type dopant of the base region.

5. The semiconductor device according to claim 4, wherein the dopant of the connecting region has a lower diffusion coefficient on the semiconductor substrate than the dopant of the base region.

6. A semiconductor device comprising a semiconductor substrate, wherein the semiconductor substrate includes:

a first conductivity type drift region;

a second conductivity type base region provided between the drift region and an upper surface of the semiconductor substrate;

two trench portions which are provided to extend in a predetermined extending direction on the upper surface of the semiconductor substrate, and provided from the upper surface of the semiconductor substrate to the drift region; and a mesa portion provided between the two trench portions, wherein at least one of the two trench portions is a gate trench portion, and the mesa portion includes:

a first conductivity type emitter region having a higher doping concentration than the drift region, which is provided to be exposed on the upper surface of the mesa portion and provided to contact both of the two trench portions;

a second conductivity type contact region provided to be exposed on the upper surface of the mesa portion alternately with the emitter region in the extending direction, and provided to contact both of the two trench portions; and a second conductivity type connecting region with a higher doping concentration than the base region, wherein the connecting region is provided to overlap with the emitter region in a top view, arranged apart from the gate trench portion, arranged below the upper surface of the mesa portion, and connects two of the contact regions sandwiching the emitter region in the extending direction, wherein both of the two trench portions are the gate trench portions, and the connecting region is arranged at a center between the two trench portions.

7. A semiconductor device comprising a semiconductor substrate, wherein the semiconductor substrate includes:

a first conductivity type drift region;

a second conductivity type base region provided between the drift region and an upper surface of the semiconductor substrate;

two trench portions which are provided to extend in a predetermined extending direction on the upper surface of the semiconductor substrate, and provided from the upper surface of the semiconductor substrate to the drift region; and a mesa portion provided between the two trench portions, wherein at least one of the two trench portions is a gate trench portion, and the mesa portion includes:

a first conductivity type emitter region having a higher doping concentration than the drift region, which is provided to be exposed on the upper surface of the mesa portion and provided to contact both of the two trench portions;

a second conductivity type contact region provided to be exposed on the upper surface of the mesa portion alternately with the emitter region in the extending direction, and provided to contact both of the two trench portions; and a second conductivity type connecting region with a higher doping concentration than the base region, wherein the connecting region is provided to overlap with the emitter region in a top view, arranged apart from the gate trench portion, arranged below the upper surface of the mesa portion, and connects two of the contact regions sandwiching the emitter region in the extending direction, wherein each of the contact region and the connecting region has a concentration peak of a doping concentration in a depth direction of the semiconductor substrate located below the upper surface of the semiconductor substrate, the doping concentration of the contact region at the upper surface of the semiconductor substrate being lower than the concentration peak of the doping concentration of the contact region, and the concentration peak of the contact region is arranged closer to the upper surface of the semiconductor substrate than the concentration peak of the connecting region.

8. A manufacturing method of a semiconductor device according to claim 3, the manufacturing method comprising:

firstly forming, on the semiconductor substrate which has the first conductivity type drift region:

the second conductivity type base region provided between the drift region and the upper surface of the semiconductor substrate;

the two trench portions provided to extend in the predetermined extending direction on the upper surface of the semiconductor substrate, and provided from the upper surface of the semiconductor substrate to the drift region;

the mesa portion provided between the two trench portions, the first conductivity type emitter region having the higher doping concentration than the drift region, which is exposed on the upper surface of the mesa portion, and contacting both of the two trench portions; and the second conductivity type contact region, which is exposed on the upper surface of the mesa portion alternately with the emitter region in the extending direction, and contacts both of the two trench portions, and secondly forming the second conductivity type connecting region with the higher doping concentration than the base region, wherein the connecting region overlaps with the emitter region in the top view, is arranged below the upper surface of the mesa portion, and connects the two of the contact regions sandwiching the emitter region in the extending direction;

wherein at least one of the two trench portions is the gate trench portion, and the method comprises forming the connecting region apart from the gate trench portion in the secondly forming.

9. The manufacturing method according to claim 8, wherein in the secondly forming, the connecting region is formed by masking a region in which the contact region is formed, and then implanting a second conductivity type dopant on the semiconductor substrate.

10. The manufacturing method according to claim 8, wherein in the secondly forming, the connecting region is formed by implanting a second conductivity type dopant into a region in which the connecting region is to be formed and at least a partial region of a region in which the contact region is formed.

11. A semiconductor device comprising a semiconductor substrate, wherein
the semiconductor substrate includes:
a first conductivity type drift region;
a second conductivity type base region provided between the drift region and an upper surface of the semiconductor substrate;
two trench portions which are provided to extend in a predetermined extending direction on the upper surface of the semiconductor substrate, and provided from the upper surface of the semiconductor substrate to the drift region; and
a mesa portion provided between the two trench portions, wherein at least one of the two trench portions is a gate trench portion, and
the mesa portion includes:
a first conductivity type emitter region having a higher doping concentration than the drift region, which is provided to be exposed on the upper surface of the mesa portion and provided to contact both of the two trench portions;
a second conductivity type contact region provided to be exposed on the upper surface of the mesa portion alternately with the emitter region in the extending direction, and provided to contact both of the two trench portions; and
a second conductivity type connecting region with a higher doping concentration than the base region, wherein the connecting region is provided to overlap with the emitter region in a top view, arranged apart from the gate trench portion, arranged below the upper surface of the mesa portion, and connects two of the contact regions sandwiching the emitter region in the extending direction, wherein the contact region and the connecting region each have a concentration peak in a doping concentration in a depth direction of the semiconductor substrate, and a full width at half maximum of the concentration peak in the connecting region is equal to or less than 50% of a full width at half maximum of the concentration peak in the contact region.

12. A manufacturing method of a semiconductor device according to claim 4, the manufacturing method comprising:
firstly forming, on the semiconductor substrate which has the first conductivity type drift region:
the second conductivity type base region provided between the drift region and the upper surface of the semiconductor substrate;
the two trench portions provided to extend in the predetermined extending direction on the upper surface of the semiconductor substrate, and provided from the upper surface of the semiconductor substrate to the drift region;
the mesa portion provided between the two trench portions,
the first conductivity type emitter region having the higher doping concentration than the drift region, which is exposed on the upper surface of the mesa portion, and contacting both of the two trench portions; and
the second conductivity type contact region, which is exposed on the upper surface of the mesa portion alternately with the emitter region in the extending direction, and contacts both of the two trench portions, and
secondly forming the second conductivity type connecting region with the higher doping concentration than the base region, wherein the connecting region overlaps with the emitter region in the top view, is arranged below the upper surface of the mesa portion, and connects the two of the contact regions sandwiching the emitter region in the extending direction;
wherein at least one of the two trench portions is the gate trench portion, and
the method comprises forming the connecting region apart from the gate trench portion in the secondly forming.

13. The manufacturing method according to claim 12, wherein in the secondly forming, the connecting region is formed by masking a region in which the contact region is formed, and then implanting a second conductivity type dopant on the semiconductor substrate.

14. The manufacturing method according to claim 12, wherein in the secondly forming, the connecting region is formed by implanting a second conductivity type dopant into a region in which the connecting region is to be formed and at least a partial region of a region in which the contact region is formed.

* * * * *